(12) United States Patent
Huang et al.

(10) Patent No.: US 10,870,914 B2
(45) Date of Patent: Dec. 22, 2020

(54) HEATING DEVICE FOR EVAPORATION, EVAPORATION DEVICE AND EVAPORATION METHOD

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Jiunsung Huang, Beijing (CN); Xiaoyun Liu, Beijing (CN); Lankai Yeh, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 539 days.

(21) Appl. No.: 15/507,516

(22) PCT Filed: Jul. 26, 2016

(86) PCT No.: PCT/CN2016/091726
§ 371 (c)(1),
(2) Date: Feb. 28, 2017

(87) PCT Pub. No.: WO2017/117978
PCT Pub. Date: Jul. 13, 2017

(65) Prior Publication Data
US 2018/0237904 A1 Aug. 23, 2018

(30) Foreign Application Priority Data

Jan. 5, 2016 (CN) .......................... 2016 1 0005830

(51) Int. Cl.
*C23C 14/24* (2006.01)
*C23C 14/26* (2006.01)
(Continued)

(52) U.S. Cl.
CPC ............ *C23C 14/543* (2013.01); *C23C 14/12* (2013.01); *C23C 14/243* (2013.01); *C23C 14/26* (2013.01); *C23C 14/541* (2013.01)

(58) Field of Classification Search
CPC ...... C23C 14/243; C23C 14/543; C23C 14/26
(Continued)

(56) References Cited

U.S. PATENT DOCUMENTS

2013/0160712 A1 6/2013 Niboshi
2014/0007814 A1* 1/2014 Villette ................. C23C 14/243
118/727
(Continued)

FOREIGN PATENT DOCUMENTS

CN  1898411 A  1/2007
CN  102023047 A  4/2011
(Continued)

OTHER PUBLICATIONS

Machine translation of Zhao CN203320117 (Year: 2013).*
(Continued)

*Primary Examiner* — Elizabeth A Burkhart

(57) ABSTRACT

A heating device for evaporation, an evaporation device and an evaporation method are provided. The heating device includes: a crucible for holding an evaporation raw material; a movable heating unit which is disposed outside the crucible and can move in the direction perpendicular to a bottom surface of the crucible; and a controller configured to control the height from the movable heating unit to the bottom surface of the crucible.

10 Claims, 3 Drawing Sheets

(51) Int. Cl.
*C23C 14/54* (2006.01)
*C23C 14/12* (2006.01)

(58) Field of Classification Search
USPC .......................................................... 118/726
See application file for complete search history.

(56) References Cited

U.S. PATENT DOCUMENTS

2015/0203958 A1* 7/2015 Yamaguchi ............. C23C 14/24
427/8
2016/0298227 A1* 10/2016 Zhang .................... C23C 14/26

FOREIGN PATENT DOCUMENTS

| CN | 102808167 A | 12/2012 |
| CN | 103305797 A | 9/2013 |
| CN | 203320117 U | 12/2013 |
| CN | 103526163 A | 1/2014 |
| CN | 103757590 A | 4/2014 |
| CN | 105112855 A | 12/2015 |
| CN | 105441878 A | 3/2016 |
| CN | 205258591 U | 5/2016 |
| JP | 2011-052301 A | 3/2011 |

OTHER PUBLICATIONS

The First Chinese Office Action dated Jul. 4, 2017; Appln. No. 201610005830.2.
International Search Report and Written Opinion dated Oct. 17, 2016; PCT/CN2016/091726.

* cited by examiner

US 10,870,914 B2

HEATING DEVICE FOR EVAPORATION, EVAPORATION DEVICE AND EVAPORATION METHOD

TECHNICAL FIELD

Embodiments of the present invention relate to a heating device for evaporation, an evaporation device and an evaporation method.

BACKGROUND

Organic materials are important for ensuring the stability of organic light-emitting diode (OLED) elements. Currently, all the large production lines adopt evaporation means for film forming, which requires a heating system for evaporation to ensure that the performances of materials cannot be deteriorated due to heating when ensuring stable evaporation rate.

SUMMARY

The present invention provides a heating device for evaporation, an evaporation device and an evaporation method. The heating device includes a crucible for holding vapor a deposition raw material; a movable heating unit which is disposed outside the crucible and being capable of moving in a direction perpendicular to a bottom surface of the crucible; and a controller configured to control a height from the movable heating unit to the bottom surface of the crucible. The heating device can solve the problems of easy sputtering of evaporation material, easy deterioration of performances, and instability in the process of adjusting the evaporation rate due to uneven heating in the conventional evaporation device.

At least one embodiment of the invention provides a heating device for evaporation, comprising: a crucible for holding vapor a deposition raw material; a movable heating unit which is disposed outside the crucible and being capable of moving in a direction perpendicular to a bottom surface of the crucible; and a controller configured to control a height from the movable heating unit to the bottom surface of the crucible.

At least one embodiment of the invention provides an evaporation device including the above heating device.

At least one embodiment of the invention provides an evaporation method for the heating device for evaporation, the heating device including a crucible for holding vapor a deposition raw material; a movable heating unit which is disposed outside the crucible and being capable of moving in a direction perpendicular to a bottom surface of the crucible; and a controller configured to control a height from the movable heating unit to the bottom surface of the crucible, the evaporation method comprising: adding an evaporation raw material into a crucible; disposing a movable heating unit at a position higher than the evaporation raw material; adopting the movable heating unit to heat and evaporate the evaporation raw material; and adopting a controller to control the movable heating unit to move in a direction perpendicular to a bottom surface of the crucible.

BRIEF DESCRIPTION OF THE DRAWINGS

Simple description will be given below to the accompanying drawings required to be used in the embodiments to provide a more clear understanding of the technical proposals of the embodiments of the present invention. Obviously, the drawings described below only involve some embodiments of the present invention. Other drawings may also be obtained by those skilled in the art without creative efforts on the basis of the accompanying drawings.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

Figure 1:
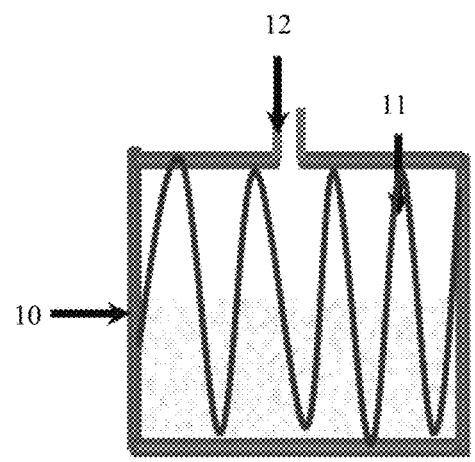
FIG. 1 is a schematic diagram of a heating device in a vapor evaporation device.

The conventional OLED line source evaporation means is as shown in FIG. 1. Evaporation raw material are placed in a crucible 10; a heating source is a heating line 11 wound and fixed on the outside of the crucible 10; and in the working process, the evaporation raw material are heated and gasified and escaped from a nozzle 12, and a film is formed on a substrate. The overall heating design improves the overall heating rate of the materials on one hand. But on the other hand, partial materials will be heated too fast and result in sputtering. Moreover, along with the continuous expansion of production lines and the continuous extension of production cycles, the volume of the crucible will also be continuously increased, so the phenomenon of uneven heating of the materials can be more serious and the sputtering phenomenon can be more and more serious as well. In addition, the overall heating means of the crucible will also allow partial organic materials (mainly at the bottom) to be always exposed under high-temperature environment and be deteriorated due to the reasons such as thermal decomposition.

Moreover, the cost of the current organic materials is high. In order to reduce the idle time of equipment on the basis of ensuring the material utilization, in the evaporation process, the evaporation rate is required to be adjusted at some moments. At this point, temperature reduction mode will be required. But in the temperature reduction mode, if the heating source is turned off once only, the evaporation rate will have instantaneous change. Subsequently, more time is required for maintaining stability. If slow temperature reduction mode is adopted, the problem that the time for adjusting the evaporation rate is too long will also occur.

The present invention provides a heating device for evaporation and an evaporation device, which can solve the problems of easy sputtering of evaporation material, easy deterioration of performances, and instability in the process of adjusting the evaporation rate due to uneven heating in the conventional evaporation device.

Clear and complete description will be given below to the technical proposals in the embodiments of the present invention with reference to the accompanying drawings in the embodiments of the present invention.

First Embodiment

Figure 2A:
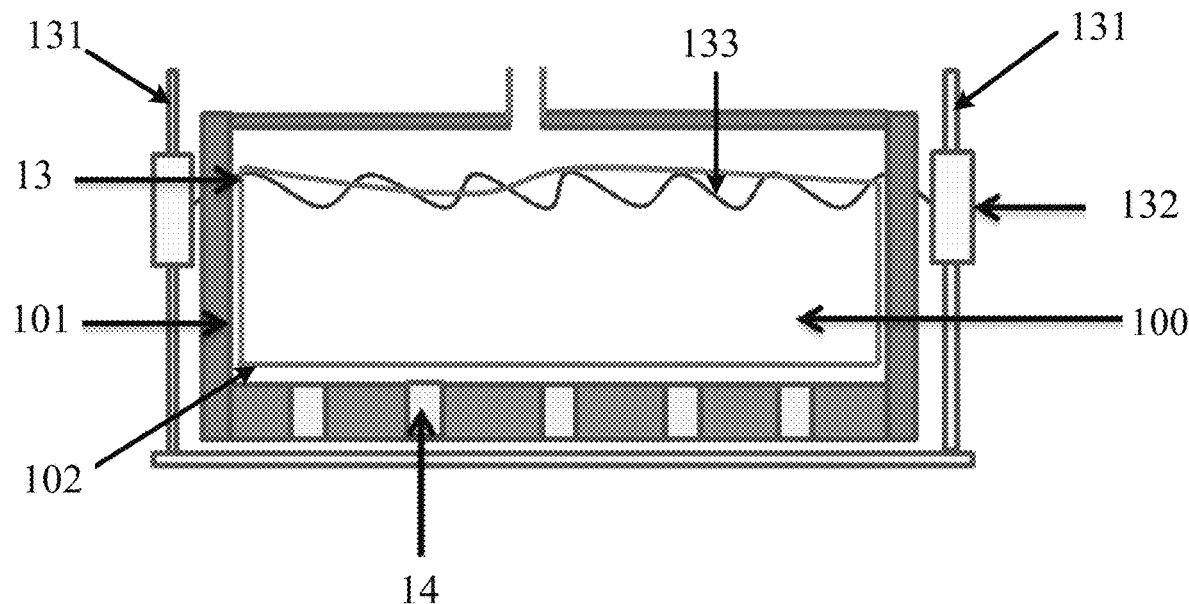
FIG. 2a is a schematic diagram of a heating device for evaporation provided by one embodiment of the present invention.

The embodiment provides a heating device for evaporation. As illustrated in FIG. 2a, the heating device comprises: a crucible 102 for holding an evaporation raw material; a movable heating unit 13 which is disposed outside the crucible 102 and can move in the direction perpendicular to a bottom surface of the crucible 102; and a controller configured to control the height from the movable heating unit 13 to the bottom surface of the crucible 102. It should be noted that the height from the movable heating unit to the bottom surface of the crucible can be converted into the height (or distance) from the movable heating unit to the evaporation material in the evaporation process.

In the heating device provided by the embodiment, as the movable heating unit can move in the direction perpendicular to the bottom surface of the crucible, in the evaporation process, the evaporation material are reduced due to evaporation, and the liquid height in the crucible is gradually reduced along with the evaporation process. At this point, the controller is adopted to control the movable heating unit to move in the direction perpendicular to the bottom surface of the crucible, and the distance between the movable heating unit and the evaporation material can be adjusted along with the reduction of the evaporation material. Thus, the evaporation material can be evenly heated, so that the problems of the sputtering of the evaporation material and the deterioration of performances can be avoided. In addition, the distance between the movable heating unit and the evaporation material may also be adjusted by adoption of the controller to control the movable heating unit to move in the direction perpendicular to the bottom surface of the crucible, so that the evaporation rate of the evaporation material can be adjusted, and hence the evaporation rate can be adjusted.

Figure 2B:
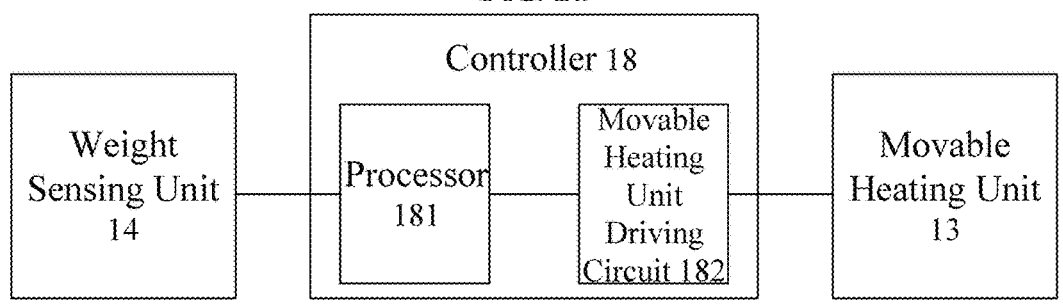
FIG. 2b is a schematic diagram of a controller in the heating device for evaporation provided by one embodiment of the present invention.

For instance, in a heating device provided by one example of the embodiment, as shown in FIG. 2a, the heating device further comprises: a weight sensing unit 14 disposed below the crucible 102 and configured to weigh the crucible 102 and the evaporation raw material in the crucible 102 and output weight information. As illustrated in FIG. 2b, the controller 18 is respectively communicated with the weight sensing unit 14 and the movable heating unit 13, receives the weight information outputted by the weight sensing unit 14, and controls the height from the movable heating unit 13 to the bottom surface of the crucible 102 according to the weight information. In the evaporation process, when the weight measured by the weight sensing unit 14 is reduced, it indicates that the mass of the evaporation material is reduced due to evaporation. Therefore, the even heating of the evaporation material and the adjustment of the evaporation rate can be achieved by adoption of the controller 18 to control the height from the movable heating unit 13 to the bottom surface of the crucible 102 according to the weight information.

For instance, in the heating device provided by one example of the embodiment, as the base area of the crucible and the inclination angle of the side wall of the crucible are known, the controller can calculate the liquid height of the evaporation raw material in the crucible according to the weight information (the weight of the evaporation material and the weight of the crucible), and control the height from the movable heating unit to the bottom surface of the crucible according to the liquid height. For instance, when the shape of the crucible is a cylinder, the base area of the crucible may be obtained according to the radius of the base area, and the inclination angle of the side wall of the crucible is zero. Moreover, the weight of the crucible is also known, and the liquid height of the evaporation raw material may be calculated according to the weight and the density of the evaporation raw material and the base area of the crucible.

For instance, in the heating device provided by one example of the embodiment, in evaporation process, the movable heating unit is disposed at a position higher than the evaporation raw material. Thus, in the evaporation process, the movable heating unit is configured to heat the evaporation raw material from the top down, so that the evaporation raw material in the crucible can be evenly heated, and hence the problem of sputtering or performance deterioration due to too fast heating, as the evaporation raw material at the bottom is always exposed in the high-temperature environment, can be avoided.

For instance, in the heating device provided by one example of the embodiment, as shown in FIG. 2b, the controller 18 includes a processor 181. The processor 181 is configured to calculate the liquid height of the evaporation raw material in the crucible 102 according to the weight information.

For instance, in the heating device provided by one example of the embodiment, as shown in FIG. 2b, the controller 18 further includes a movable heating unit driving circuit 182. The movable heating unit driving circuit 182 is respectively connected with the processor 181 and the movable heating unit 13 and configured to control the height from the movable heating unit 13 to the bottom surface of the crucible 102 according to the liquid height calculated by the processor 181.

Second Embodiment

The embodiment provides a heating device for evaporation. As illustrated in FIG. 2a, the device comprises: a crucible 102 for holding an evaporation raw material; a movable heating unit 13 which is disposed outside the crucible 102 and is higher than the upper part of the evaporation raw material in the evaporation process (namely the movable heating unit is disposed at a position higher than the evaporation raw material), and that is to say, in the evaporation process, the movable heating unit 13 is disposed above an upper surface of the evaporation raw material; a weight sensing unit 14 which is disposed below the crucible 102 and configured to weigh the crucible 102 and the evaporation raw material in the crucible 102 and output weight information; and a controller which is configured to receive the output of the weight sensing unit 14, calculate the liquid height of the evaporation raw material in the crucible 102 according to the weight of the crucible and the evaporation raw material in the crucible 102, and control the height from the movable heating unit 13 to the evaporation draw material, namely the height from the movable heating unit 13 to a bottom surface of the crucible 102, according to the liquid height.

For instance, in the heating device provided by one example of the embodiment, as shown in FIG. 2*b*, the controller 18 is communicated with the weight sensing unit 14, and is communicated with the movable heating unit 13 and configured to control the movable heating unit 13 to move. It should be noted that the communication may be achieved by the connection of signal lines or wireless means. No limitation will be given here in the present invention.

In the embodiment, the movable heating unit 13 is disposed outside the crucible 102, and is disposed above the evaporation raw material in the evaporation process and configured to heat the evaporation raw material from the top down, so that the evaporation raw material in the crucible 102 can be evenly heated, and hence the problem of sputtering or performance deterioration due to too fast heating, as the evaporation raw material at the bottom are always exposed in the high-temperature environment, can be avoided. The weight sensing unit 14 is disposed below the crucible 102, connected with the controller through a signal line (or connected by wireless communication), and configured to weigh the crucible 102 and the evaporation raw material in the crucible 102 and output weight information to the controller. The weight sensing unit 14 converts the weight of the crucible 102 and the evaporation raw material in the crucible 102 into electrical signals for output, and the controller is adopted to control the movable heating unit 13. The controller receives the output of the weight sensing unit 14, calculates the liquid height of the evaporation raw material in the crucible 102 according to the weight of the crucible 102 and the evaporation raw material in the crucible 102, and controls the position of the movable heating unit 13 and adjust the height from the movable heating unit 13 to the evaporation raw material, namely the height from the movable heating unit 13 to the bottom surface of the crucible 102, according to the liquid height.

Figure 2C:
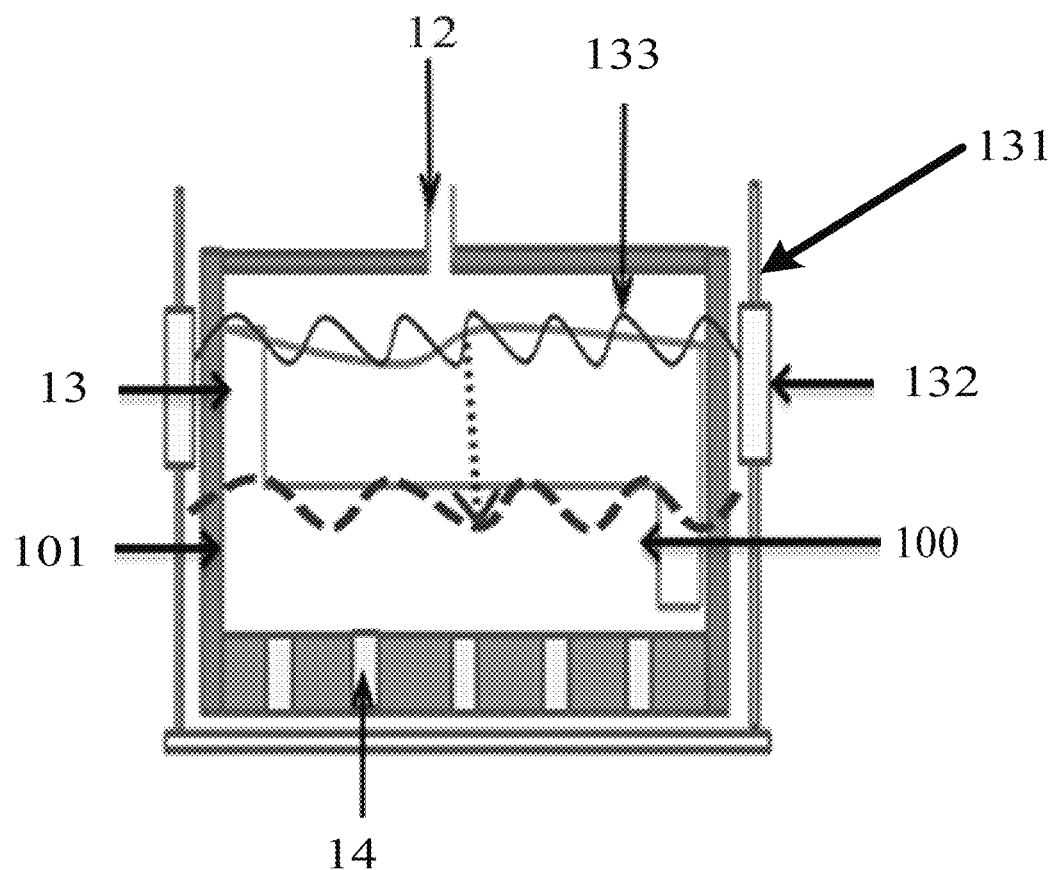
FIG. 2c is a schematic working diagram of the heating device for evaporation provided by one embodiment of the present invention.

In the heating device provided by the embodiment, as shown in FIG. 2*c*, in evaporation process, the evaporation material are reduced due to evaporation, and the liquid height in the crucible is gradually reduced along with the evaporation process. At this point, the liquid height of the evaporation material in the crucible may be calculated according to the weight information measured by the weight sensing unit. Subsequently, the controller may be adopted to control the movable heating unit to move in the direction perpendicular to the bottom surface of the crucible, and the distance between the movable heating unit and the evaporation material may be adjusted along with the reduction of the evaporation material, so that the evaporation material can be evenly heated, and hence the problems of the sputtering of the evaporation material, the deterioration of performances and the like can be avoided. In addition, the distance between the movable heating unit and the evaporation material may also be adjusted by adoption of the controller to control the movable heating unit to move in the direction perpendicular to the bottom surface of the crucible, so that the evaporation rate of the evaporation material can be adjusted, and hence the evaporation rate can be adjusted.

For instance, in the heating device provided by one example of the embodiment, the weight sensing unit may include semiconductor pressure sensors. Of course, the present invention includes but not limited thereto. The weight sensing unit may also include other types of sensors for weighing.

It should be noted that the proposal of adopting the controller to control the height from the movable heating unit to the evaporation raw material is multiple, and may be set by those skilled in the art according to actual conditions. For instance, the controller is configured to control the height from the movable heating unit to the evaporation raw material, so that the height from the movable heating unit to the evaporation raw material can keep constant. Thus, on one hand, stable evaporation rate can be obtained, and on the other hand, the film forming conditions (mainly temperature) will not have large change due to the consumption of the evaporation raw material, so the formed film can have higher quality. Another optional control proposal is that the controller is configured to calculate the current liquid height of the evaporation raw material in the crucible, calculate required height settings between the movable heating unit and the evaporation raw material for reaching the required evaporation rate according to the inputted evaporation rate and the current liquid height of the evaporation raw material, and convert the settings into instructions capable of being identified by the movable heating unit and send the instructions to the movable heating unit. Wherein, the calculation process may utilize data and formulas inputted in advance, and the value may be set by those skilled in the art according to specific application conditions. No further description will be given here. The controller includes a logic device which can achieve the above control function, e.g., a single chip microcomputer, and has certain storage and programming functions.

The heating device provided by the embodiment utilizes mass feedback signals to control the movement of the heating unit and can solve the possible problem of the sputtering of materials or the deterioration of partial materials due to uneven heating of the raw material in the crucible in the evaporation process for a long time. In addition, the heating efficiency of the evaporation material can be improved by controlling the movable heating unit (for instance, when the liquid height of the evaporation material is reduced, the height of the movable heating unit may be reduced along with it, so that the distance between the movable heating unit and the evaporation material can be shortened, and hence the heating effect can be improved), so that the effect of increasing the yield of equipment can be achieved. Moreover, the evaporation rate can also be more conveniently adjusted, and faster cooling rate can be achieved when temperature reduction is required (for instance, the movable heating unit is controlled to be away from the evaporation material), and hence the objectives of reducing the idle time of equipment and reducing the production cost can be achieved.

Figure 3:
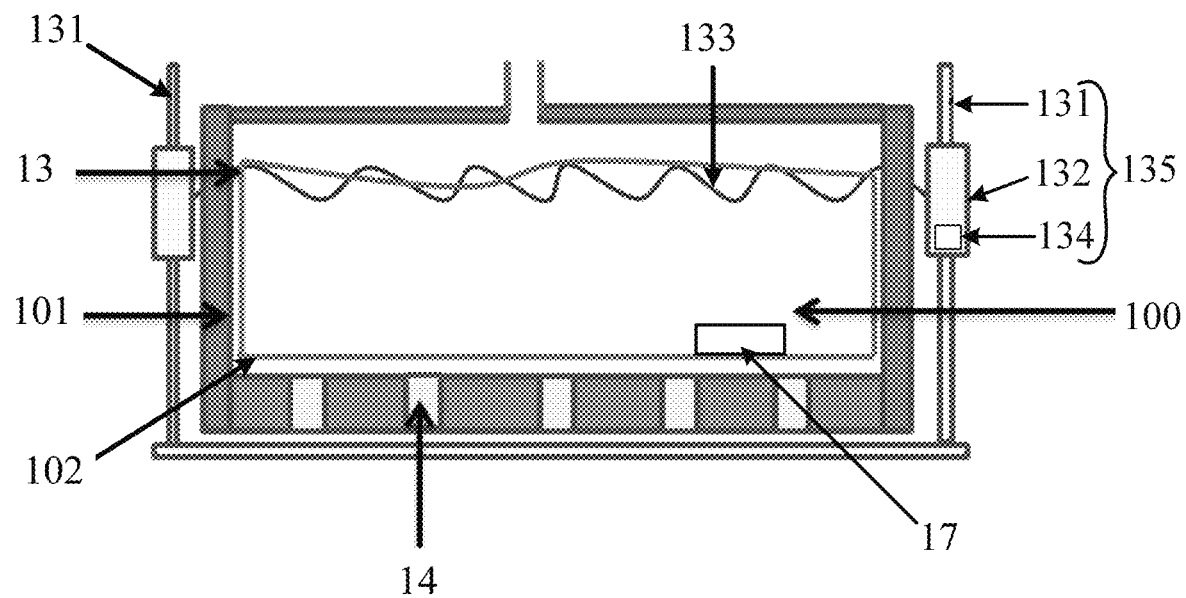
FIG. 3 is a schematic diagram of another heating device for evaporation provided by one embodiment of the present invention.

For instance, in a heating device provided by one example of the embodiment, as shown in FIG. 3, the heating device 100 comprises a crucible housing 101 and a crucible 102 disposed in the crucible housing 101. A movable heating unit 13 may include a heating unit 133 and a driving mechanism 135 configured to drive the heating unit 133 to be away from or close to evaporation raw material (a bottom surface of the crucible 102). As illustrated in FIG. 3, the heating unit 133, for instance, may be a heating wire 133 which is arranged close to the outer wall of the crucible 102; and the driving mechanism 135 includes: at least two upright posts 131 of which the longitudinal direction is perpendicular to the bottom of the crucible 102; two movable supports 132 respectively disposed on the upright posts 131, in which two end portions of the heating wire 133 are respectively fixed on the movable supports 132 of the two upright posts; and a drive motor 134 configured to drive the movable support 132 to move along the upright post 131.

It should be noted that the embodiment of the present invention includes but not limited thereto, and the driving mechanism may also be other driving structures. In addition, the case that the longitudinal direction of the upright post 131 is perpendicular to the bottom of the crucible 102 is not strictly limited, as long as the setting direction of the upright post 131 allows the heating wire 133 to move along the upright post 131 so as to be close to or away from the evaporation raw material in the crucible 102.

For instance, in the heating device provided by one example of the embodiment, as shown in FIG. 3, a weight sensing unit 14 is disposed in the crucible housing 101 and disposed below the crucible 102. Thus, the damage or pollution of the weight sensing unit 14 due to the high-temperature environment of the crucible 102 or the evaporation material can be avoided.

For instance, in the heating device provided by one example of the embodiment, as shown in FIG. 3, the drive motor 134 is configured to drive the movable support 132 to move along the upright post 131. In the figure, the shape of the movable support 132 is blocky, and the drive motor 134 may be directly disposed in the blocky movable support 132.

For instance, in the heating device provided by one example of the embodiment, the number of the heating wires 133 is not limited to be one, and a plurality of heating wires in parallel may be adopted.

Figure 4:
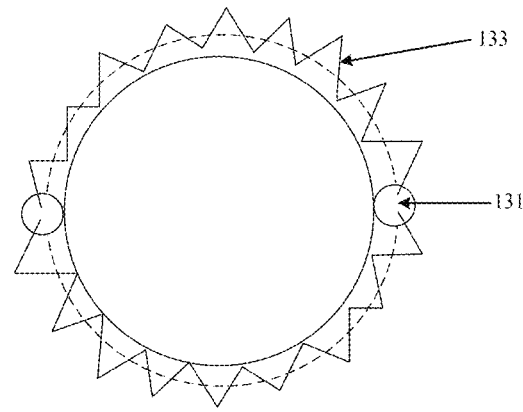
FIG. 4 is a schematic top view of the heating device for evaporation provided by one embodiment of the present invention.
Figure 5:
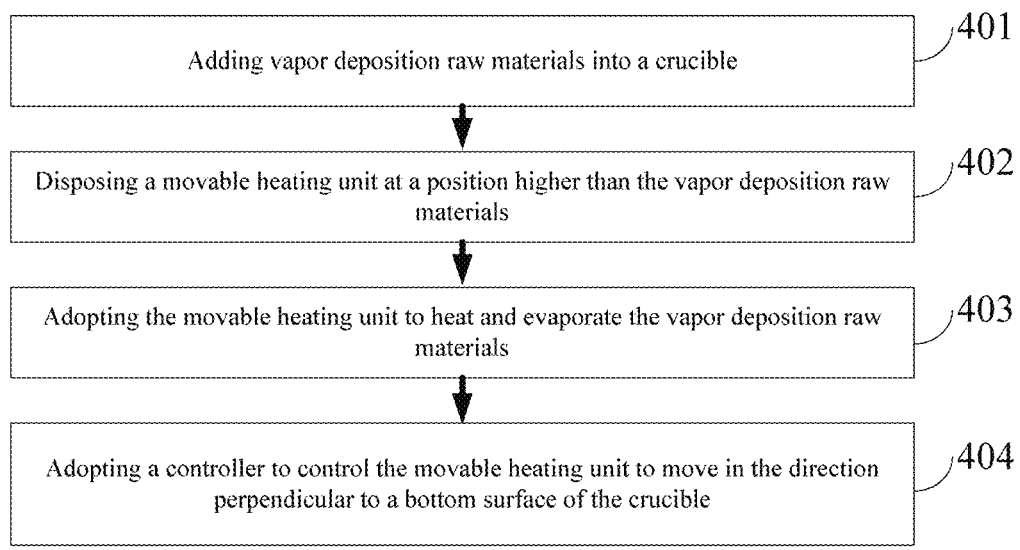
FIG. 5 is a schematic diagram of an evaporation method provided by one embodiment of the present invention.

For instance, in the heating device provided by one example of the embodiment, as shown in FIG. 4, the outer wall of the crucible 102 is a cylinder, and the heating wire 133 may be disposed around the outer wall of the crucible 102, so that the objective of even heating can be achieved. Obviously, when the outer wall of the crucible is in other shapes, the heating wire may be also disposed around the outer wall of the crucible, so that the objective of even heating can be achieved. No further description will be given here in the embodiment of the present invention.

Taking the application of the heating device provided by the embodiment of the present invention in the evaporation of organic materials in the manufacturing process of OLEDs as an example, after the crucible 102 added with the organic materials is placed into the crucible housing 101, the weight sensing unit 14 disposed below the crucible 102 will transmit a signal to the driving mechanism to adjust the position of the heating wire in the heating unit, so that the heating rate of the organic materials can be maximum in the case that sputtering does not occur. In the working process, the controller will control the heating wire 133 to move and heat according to the mass change signal fed back by the weight sensing unit 14. Thus, the time of the organic materials exposed under high temperature can be reduced, and the evaporation rate required for evaporation can be maintained continuously.

For instance, in the heating device provided by one example of the embodiment, as shown in FIG. 3, the heating device may further comprise: a temperature sensing unit 17 configured to measure the temperature of the evaporation raw material. The temperature sensing unit 17 is connected with the controller (connected by a signal line or wireless means), and the controller is also configured to control the height from the movable heating unit to the evaporation material according to the temperature of the evaporation raw material.

For instance, in the heating device provided by one example of the embodiment, as shown in FIG. 3, the temperature sensing unit may be disposed in the crucible. Of course, the embodiment of the present invention includes but not limited thereto. The temperature sensing unit may be also disposed outside the crucible. For instance, the temperature of the evaporation material is acquired by measuring an infrared spectrum emitted by the evaporation material.

It should be noted that in the evaporation process, the evaporation rate must be adjusted at some moments. At this point, temperature reduction mode will be required. In the temperature reduction mode, if the heating source is turned off once only, the evaporation rate will have instantaneous change. Subsequently, more time is required for maintaining stability. If slow temperature reduction mode is adopted, the problem that the time for adjusting the evaporation rate is too long will also occur. The heating device provided by the present invention can reduce the temperature immediately by allowing the heating wire to be away from the evaporation raw material, can control the driving mechanism to move the heating unit according to a temperature signal when the temperature variation is too large, and hence increase the cooling rate, and correspondingly, can also reduce the consumption of unnecessary organic materials.

In the heating device provided by the embodiment, the movable heating unit is disposed above the evaporation raw material on the outside of the crucible, so as to heat the evaporation raw material from the upper part; the weight sensing unit is disposed below the crucible and configured to weigh the crucible and the evaporation raw material in the crucible and output weight information to the controller; and the controller is configured to calculate the liquid height of the evaporation raw material in the crucible according to the weight of the crucible and the evaporation raw material in the crucible, control the height from the movable heating unit to the evaporation raw material according to the liquid height, and hence control the heating degree of the evaporation raw material, so that the problem of sputtering or performance deterioration due to too fast heating, as partial evaporation raw material (mainly at the bottom) are always exposed in high-temperature environment, can be avoided. The evaporation rate may be adjusted by directly adjusting and controlling the height from the movable heating unit to the evaporation raw material, so the problem of instability during the adjustment of the evaporation rate will not occur.

Third Embodiment

The embodiment provides an evaporation device, which comprises any foregoing heating device. In the evaporation device, the movable heating unit is applied. In different processing steps, the heating unit may be moved up and down to increase the heating-up time or the cooling time of the materials, so that the heating efficiency of the materials can be improved. The weight sensing unit is configured to convert the mass of the materials into an electrical signal to control the heating unit in the crucible to move to a proper position. For instance, the evaporation device provided by the present invention can adopt the precise weight sensing unit for measurement according to different material consumptions in the crucible at each stage, and feed back the value to the controller for controlling the heating unit, so that the heating unit can move, and hence even heating of the materials in the crucible can be achieved. Thus, the phenomenon of the deterioration of some organic materials with high heat sensitivity, due to uneven heating of the organic materials in the long-time heating process, can be avoided, or the phenomenon of the fluctuation of the evaporation rate in the consumption process of the organic materials due to uneven heating can be avoided. In summary, the evaporation device provided by the present invention allows the evaporation raw material in the crucible to be evenly heated, avoids the phenomena of the sputtering of the evaporation material and the deterioration of performances, and meanwhile, facilitates the adjustment of the evaporation rate.

Fourth Embodiment

The embodiment provides an evaporation method. A heating device includes: a crucible; a movable heating unit which is disposed on the outside of the crucible and can move in the direction perpendicular to a bottom surface of the crucible; and a controller configured to control the height from the movable heating unit to the bottom surface of the crucible. The evaporation method comprises the steps S401 to S404.

S401: adding evaporation raw material into the crucible.

S402: disposing the movable heating unit at a position higher than the evaporation raw material.

S403: adopting the movable heating unit to heat and evaporate the evaporation raw material.

S404: adopting the controller to control the movable heating unit to move in the direction perpendicular to a bottom surface of the crucible.

In the evaporation method provided by the embodiment, the movable heating unit is disposed above the evaporation raw material in the evaporation process and configured to heat the evaporation raw material from the top down, so the evaporation raw material in the crucible can be evenly heated, and hence the problem of sputtering or performance deterioration due to too fast heating, as the evaporation raw material at the bottom are always exposed in high-temperature environment, can be avoided. In addition, in the evaporation process, the evaporation material are reduced due to evaporation, so the controller may be adopted to control the movable heating unit to move in the direction perpendicular to the bottom surface of the crucible, and the distance between the movable heating unit and the evaporation material can be adjusted along with the reduction of the evaporation material. Thus, the evaporation material can be evenly heated, and hence the problems of the sputtering of the evaporation material and the deterioration of performances can be avoided. In addition, the distance between the movable heating unit and the evaporation material may also be adjusted by adoption of the controller to control the movable heating unit to move in the direction perpendicular to the bottom surface of the crucible, so that the evaporation rate of the evaporation material can be adjusted, and hence the evaporation rate can be adjusted.

For instance, in the evaporation method provided by one example of the embodiment, the heating device further includes a weight sensing unit which is disposed below the crucible. The evaporation method comprises: adopting the weight sensing unit to weigh the crucible and the evaporation raw material in the crucible and output weight information; calculating the liquid height of the evaporation raw material in the crucible according to the weight information; and adopting the controller to control the movable heating unit to move in the direction perpendicular to the bottom surface of the crucible according to the liquid height. Thus, the liquid height of the evaporation material in the crucible is gradually reduced along with the evaporation process. At this point, the liquid height of the evaporation material in the crucible may be calculated according to the weight information measured by the weight sensing unit. Subsequently, even heating of the evaporation material and the adjustment of the evaporation rate may be achieved by adoption of the controller to control the movable heating unit to move in the direction perpendicular to the bottom surface of the crucible according to the liquid height.

For instance, in the evaporation method provided by one example of the embodiment, the controller is adopted to control the height from the movable heating unit to the evaporation raw material to keep constant. Thus, the heating uniformity of the evaporation material can be further improved.

For instance, in the evaporation method provided by one example of the embodiment, the heating device further includes a temperature sensing unit. The evaporation method comprises: adopting the temperature sensing unit to measure the temperature of the evaporation raw material; and adopting the controller to control the height from the movable heating unit to the evaporation raw material according to the temperature of the evaporation raw material. Thus, the height from the movable heating unit to the evaporation raw material may be controlled according to the temperature of the evaporation material, so that even heating of the evaporation material and the adjustment of the evaporation rate can be achieved.

For instance, in the evaporation method provided by one example of the embodiment, when the temperature of the evaporation raw material is reduced, the controller is adopted to control the movable heating unit to move towards the direction close to the evaporation raw material, so that the heating efficiency of the movable heating unit on the evaporation raw material can be improved.

For instance, in the evaporation method provided by one example of the embodiment, when the temperature of the evaporation raw material is raised, the controller is adopted to control the movable heating unit to move towards the direction away from the evaporation raw material, so that the heating efficiency of the movable heating unit on the evaporation raw material can be reduced.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201610005830.2, filed Jan. 5, 2016, the disclosure of which is incorporated herein by reference as part of the application.

The invention claimed is:

1. A heating device for evaporation, comprising:
   a crucible for holding vapor an evaporation raw material;
   a movable heating unit which is disposed outside the crucible and being capable of moving in a direction perpendicular to a bottom surface of the crucible;
   a weight sensing unit which is disposed below the crucible and configured to weigh the crucible and the evaporation raw material in the crucible and output weight information;

a controller configured to control a height from the movable heating unit to the bottom surface of the crucible; and a temperature sensing unit which is connected with the controller and configured to measure a temperature of the evaporation raw material by measuring an infrared spectrum emitted by the evaporation raw material, wherein the controller is respectively communicated with the weight sensing unit and the movable heating unit and configured to:

receive the weight information outputted by the weight sensing unit, calculate a liquid height of the evaporation raw material in the crucible according to the weight information, a density of the evaporation raw material, and an area of the bottom surface of the crucible, control the height from the movable heating unit to the bottom surface of the crucible according to the liquid height, and control the height from the movable heating unit to the evaporation raw material according to the temperature of the evaporation raw material, wherein the movable heating unit is disposed at a position higher than the evaporation raw material in an evaporation process, wherein, when the movable heating unit is controlled by the controller to move in the direction perpendicular to the bottom surface of the crucible, a distance between the movable heating unit and the evaporation raw material is adjusted, so that the evaporation rate of the evaporation raw material is adjusted.

2. The heating device according to claim 1, wherein the controller includes a processor which is configured to calculate the liquid height of the evaporation raw material in the crucible according to the weight information.

3. The heating device according to claim 2, wherein the controller further includes a movable heating unit driving circuit which is respectively connected with the processor and the movable heating unit and configured to control the height from the movable heating unit to the bottom surface of the crucible according to the liquid height calculated by the processor.

4. The heating device according to claim 1, wherein the movable heating unit includes:
a heating unit; and
a driving mechanism configured to drive the heating unit to be away from or close to the bottom surface of the crucible.

5. The heating device according to claim 4, wherein the driving mechanism includes:
at least two upright posts, in which a longitudinal direction of the upright post is perpendicular to the bottom surface of the crucible;
two movable supports respectively disposed on the upright posts, in which two end portions of the heating unit are respectively fixed on the two movable supports; and
a drive motor configured to drive the movable support to move along the upright post.

6. The heating device according to claim 4, wherein the heating unit includes:
a heating wire arranged close to an outer wall of the crucible.

7. The heating device according to claim 1, wherein the controller is configured to control a height from the movable heating unit to the evaporation raw material to keep constant.

8. The heating device according to claim 1, further comprising:
a crucible housing, in which the crucible is disposed in the crucible housing; and
the weight sensing unit is disposed in the crucible housing and disposed below the crucible.

9. The heating device according to claim 1, wherein the weight sensing unit includes a semiconductor pressure sensor.

10. An evaporation device, comprising the heating device according to claim 1.

* * * * *